US012603475B2

(12) United States Patent　　　(10) Patent No.: US 12,603,475 B2
Steele et al.　　　(45) Date of Patent: Apr. 14, 2026

(54) DEVICES AND METHODS FOR TUNING VERTICAL-CAVITY SURFACE-EMITTING LASERS WITH MODULATED BIT SIGNALS

(71) Applicant: ams International AG, Jona (CH)

(72) Inventors: Colin Steele, Jona (CH); Catalin Lazar, Jona (CH); Goran Stojanovic, Jona (CH)

(73) Assignee: ams International AG, Jona (CH)

( * ) Notice: Subject to any disclaimer, the term of this patent is extended or adjusted under 35 U.S.C. 154(b) by 1143 days.

(21) Appl. No.: 17/622,243

(22) PCT Filed: May 13, 2020

(86) PCT No.: PCT/EP2020/063357
§ 371 (c)(1),
(2) Date: Dec. 23, 2021

(87) PCT Pub. No.: WO2020/259914
PCT Pub. Date: Dec. 30, 2020

(65) Prior Publication Data
US 2022/0337032 A1　　Oct. 20, 2022

(30) Foreign Application Priority Data

Jun. 26, 2019　(EP) ..................................... 19182623

(51) Int. Cl.
*H01S 5/062* (2006.01)
*H01S 5/042* (2006.01)
*H01S 5/183* (2006.01)
(52) U.S. Cl.
CPC .......... *H01S 5/0622* (2013.01); *H01S 5/0428* (2013.01); *H01S 5/183* (2013.01); *H01S 5/06216* (2013.01)

(58) Field of Classification Search
CPC ...... H01S 5/0622; H01S 5/0428; H01S 5/183; H01S 5/06216; H01S 5/0617; H01S 5/06804; H01S 5/0687
See application file for complete search history.

(56) References Cited

U.S. PATENT DOCUMENTS

| | | | | |
|---|---|---|---|---|
| 6,636,544 B2 * | 10/2003 | Baillargeon | ............ | H01S 5/423 |
| | | | | 257/E33.068 |
| 7,768,216 B2 * | 8/2010 | Pauritsch | ............. | G09G 3/3406 |
| | | | | 315/307 |

(Continued)

FOREIGN PATENT DOCUMENTS

| | | |
|---|---|---|
| CN | 101689060 A | 3/2010 |
| CN | 103024987 A | 4/2013 |

(Continued)

OTHER PUBLICATIONS

Search Report for JP Patent Applicaiton No. 2021-575040, communicated on Dec. 23, 2022, 17 pages (For informational purposes only).

(Continued)

*Primary Examiner* — M. A. Golub-Miller
(74) *Attorney, Agent, or Firm* — Viering, Jentschura & Partner mbB

(57) ABSTRACT

A tuning arrangement for a vertical-cavity surface-emitting laser (VCSEL) may include a delta sigma modulator and a current source. The delta sigma modulator may be configured to generate a bitstream comprising bit signals, and the current source may be configured to provide a current to the VCSEL in a switchable manner depending on a control signal. The bitstream is generated based on a target state signal and the control signal corresponds to or is derived from the bit signals of the bitstream.

9 Claims, 3 Drawing Sheets

(56) References Cited

U.S. PATENT DOCUMENTS

| | | | |
|---|---|---|---|
| 2002/0105982 A1 | 8/2002 | Chin et al. | |
| 2003/0002141 A1* | 1/2003 | DeCusatis | H01S 5/0687 |
| | | | 359/337.11 |
| 2003/0002545 A1* | 1/2003 | Jiang | H01S 5/041 |
| | | | 372/50.1 |
| 2003/0189505 A1* | 10/2003 | Okamoto | H03L 7/087 |
| | | | 341/144 |
| 2004/0169437 A1 | 9/2004 | Orsier et al. | |
| 2006/0279438 A1 | 12/2006 | Kishi et al. | |
| 2007/0041416 A1* | 2/2007 | Koelle | H01S 5/18358 |
| | | | 372/50.124 |
| 2008/0007497 A1 | 1/2008 | Pauritsch | |
| 2009/0001905 A1* | 1/2009 | VanEss | H05B 45/37 |
| | | | 315/302 |
| 2010/0231132 A1 | 9/2010 | Logiudice et al. | |
| 2013/0076250 A1 | 3/2013 | Logiudice | |
| 2013/0293404 A1 | 11/2013 | Stockstad | |
| 2014/0070727 A1 | 3/2014 | Pflaum | |
| 2014/0203709 A1 | 7/2014 | Pflaum | |
| 2022/0091237 A1* | 3/2022 | Poirier | H03M 1/1023 |

FOREIGN PATENT DOCUMENTS

| | | | |
|---|---|---|---|
| CN | 103687184 A | 3/2014 | |
| CN | 103945601 A | 7/2014 | |
| DE | 10357776 A1 | 7/2005 | |
| EP | 2081414 A1 | 7/2009 | |
| EP | 2575411 A1 | 4/2013 | |
| JP | 2002204022 A | 7/2002 | |
| JP | 2003298424 A | 10/2003 | |
| JP | 2005064700 A | 3/2005 | |
| JP | 2009542020 A | 11/2009 | |
| JP | 2010214872 A | 9/2010 | |
| JP | 2016127214 A | 7/2016 | |
| JP | 2016127217 A | 7/2016 | |
| JP | 2017207412 A | 11/2017 | |
| KR | 1020090034911 A | 4/2009 | |

OTHER PUBLICATIONS

Notice of Reasons for Refusal for JP Patent Application No. 2021-575040, dated Dec. 26, 2022, 4 pages (For informational purposes only).

Laurens Breyne et al., "Comparison Between Analog Radio-Over-Fiber and Sigma Delta Modulated Radio-Over-Fiber", IEEE Photonics Technology Letters 2017, Nov. 1, 2017, pp. 1-4, vol. 29, Issue 21.

Takamasa Suzuki et al., "Real-time displacement measurement using VCSEL interferometer", Proceedings of SPIE, Optical Metrology and Inspection for Industrial Applications II, 85630K-6, Nov. 20, 2012, 6 pages, vol. 8563.

Brahim Can Sezgin et al., "A Flexible Multi-Gbps Transmitter Using Ultra-High Speed Sigma-Delta-over-Fiber", 2018 IEEE/MTT-S International Microwave Symposium—IMS, Jun. 10-15, 2018, pp. 1195-1198, IEEE, Philadelphia, PA, USA.

International Search Report issued for the corresponding International patent application No. PCT/EP2020/063357, dated Jul. 22, 2020, 3 pages (for informational purposes only).

Chinese office action issued for the corresponding Chinese patent application No. 202080046620.2, dated Dec. 11, 2023, 10 pages (for informational purposes only).

* cited by examiner

DEVICES AND METHODS FOR TUNING VERTICAL-CAVITY SURFACE-EMITTING LASERS WITH MODULATED BIT SIGNALS

CROSS-REFERENCE TO RELATED APPLICATIONS

The present application is a national stage entry according to 35 U.S.C. § 371 of PCT application No.: PCT/EP2020/063357 filed on May 13, 2020; which claims priority to European Patent Application Serial No.: 19182623.9 filed on Jun. 26, 2019; all of which are incorporated herein by reference in their entirety and for all purposes.

TECHNICAL FIELD

This disclosure relates generally to a tuning arrangement for a vertical-cavity surface-emitting laser, VCSEL, and to a method for tuning a VCSEL.

BACKGROUND

For many applications it is desirable to have lasers that are tunable in terms of their wavelength with a high resolution. Particularly when exciting optical resonators or for operating optical interferometers that are commonly used in state-of-the-art high sensitivity displacement sensors, laser light tuned to an exact wavelength is essential for achieving a certain efficiency and/or sensitivity of the system. Vertical-cavity surface-emitting lasers, VCSELS, provide a suitable solution for these applications as they can be manufactured cost-efficiently and integrated with the desired system using wafer scale processing. Compared to conventional Fabry-Pérot diode lasers, VCSELs are characterized by a superior high speed modulation efficiency. To date, VCSELs are tuned in terms of their wavelength using analog integrators or high resolution IDACs with several weighted tappings connected in parallel in a feedback loop controlled by the output of an optical component such as a reference cavity or an interferometer. This leads to a complicated and sensitive setup that may also lack flexibility.

An object to be achieved is to provide an improved concept for a tuning arrangement for a VCSEL and for a method for tuning a VCSEL.

SUMMARY

This object is achieved with the subject-matter of the independent claims. Embodiments and developments of the improved concept are defined in the dependent claims.

The improved concept is based on the idea of digitally tuning the wavelength of a VCSEL using a delta sigma modulator to give a single-bit or a low-resolution bitstream that controls a single-bit or low-resolution IDAC or switch. The multi-bit bitstream may be employed to digitally assist a simple 4-bit IDAC, for example, in order to achieve an increased resolution and to realize conventional digital signal processing methods such as dynamic element matching, DEM, or dithering, for instance. In particular, as the wavelength of a VCSEL depends on a bias current applied to the VCSEL, the delta sigma modulator effectively controls the bias current in order to tune the wavelength of the VCSEL.

In particular, a tuning arrangement for a VCSEL according to the improved concept comprises a delta sigma modulator that is configured to generate a bitstream comprising bit signals, and a current source that is configured to provide a current to the VCSEL in a switchable manner depending on a control signal. The bitstream is generated based on a target state signal and the control signal corresponds to or is derived from the bit signals of the bitstream.

In a VCSEL the emission wavelength is determined by the cavity resonance instead of by a gain peak as it is the case for Fabry-Pérot type edge-emitting lasers, for instance. Thereby, VCSELs show a significant temperature dependence in their emission wavelength that is caused by both thermal expansion of semiconductor layers, i.e. the cavity length, of the VCSEL and a thermal refractive effect, i.e. changes of the average refractive index in the resonator due to temperature fluctuations. Typical emission wavelength changes of a VCSEL due to temperature changes occur with about 0.07 nm/K. The temperature of a VCSEL can be adjusted in a straightforward manner by means of a current, such as a bias current, applied to the VCSEL.

Due to the strong temperature behavior, conventional VCSELs are characterized by large modulation efficiencies in the order of 0.5 nm/mA, which is about two orders of magnitude larger compared to the modulation efficiency of typical laser diodes. Therefore, the wavelength of a VCSEL can be efficiently tuned by means of applying bias currents at reasonable levels even for integrated CMOS current sources and other components.

The improved concept realizes the tuning of the VCSEL by means of a single switchable current source that provides a constant bias current to the VCSEL. The principle may be understood as regulating the temperature of the VCSEL or of components of the VCSEL such as its semiconductor layers, to a certain set point by switching on and off a bias current that dissipates heat within the VCSEL. The current source is, for example, an integrated circuit, IC, current source that has a constant output current which is switched on and off based on a level of a control signal that is applied to the current source.

The control signal applied to the current source either corresponds to or is derived from the bit signals of the bitstream that is generated by the delta sigma modulator based on a target state signal. The delta sigma modulator is, for example, a single bit delta sigma ADC, which may likewise be an integrated circuit. The operational principle of delta sigma modulation is sufficiently established and therefore is not further detailed here. For example, the current source is configured to enable outputting of the bias current if the bit signals of the bit stream are of a high value, i.e. of a value 1, and to disable the output for low bit signals, i.e. bit signals of value 0.

The target state signal provided to the delta sigma modulator may, for example, correspond to a target temperature of the VCSEL or of components of the VCSEL. In this way, a regulation of the wavelength of the VCSEL, i.e. the tuning, is achieved by means of regulating a temperature via a modulation generated by the delta sigma modulator.

The tuning arrangement may be an integrated circuit, such as a CMOS integrated circuit, for instance.

In some embodiments, the control signal is a pulse density modulation, PDM, signal.

Compared to a classical pulse width modulation, PWM, in which the current source is switched on and off with a certain reference and a certain duty cycle, the bit signals of the bitstream may represent a pulse density modulation, PDM. For instance, the delta sigma modulator is a one-bit quantizer that produces either a high or a low value for a bit signal of the bitstream depending on an amplitude of the target state signal. The one-bit quantizer may further negatively feedback the quantization error in the delta sigma process loop such that the quantization error is averaged out across multiple bit signals of the bitstream. A PDM signal is the generalized form of a PWM signal, which has no fixed frequency between high and low values. A PDM-type bitstream may therefore be capable of regulating the temperature more efficiently and reliably compared to a PWM signal.

In some embodiments, the current is provided to the VCSEL as a bias current.

In some embodiments the bias current is configured to control a temperature and/or an output power of the VCSEL.

As mentioned above, the bias current may serve the purpose of dissipating heat within components of the VCSEL in order to increase the temperature and hence cause a change in the emission wavelength. Accordingly, in the absence of the bias current, i.e. when the current source is switched off, the accumulated heat in the VCSEL component is dissipated to the environment of the VCSEL, hence causing a cooldown. Alternatively or in addition, the bias current may serve the purpose of influencing the output power of the VCSEL itself, e.g. by increasing the operating current of the VCSEL. As more optical power means more heat due to optical absorption, likewise the VCSEL can be elevated this way in terms of temperature in order to tune the emission wavelength.

In some embodiments the target state signal corresponds to or is derived from a target wavelength.

Ideally, the tuning arrangement allows for adjusting the VCSEL to a specific wavelength instead of to a temperature, as the emission wavelength is the intended adjustment quantity. For example, the tuning arrangement comprises means, such as a lookup table, with which a target emission wavelength is converted to a target temperature and eventually provided to the delta sigma modulator. In this way, no manual conversion has to be performed in order to tune the VCSEL to a specific emission wavelength.

In some embodiments, the tuning arrangement further comprises an input processor that is configured to generate the target state signal by applying a linearization algorithm to an input signal.

An input signal for the tuning arrangement may be a digital control word corresponding to a digitized expression for the target state, such as a target wavelength. An input processor is employed in these embodiments in order to convert the input signal to the target state signal that may likewise be a digital control word that corresponds to an actual set point for the delta sigma modulator. For example, the target state signal is a digitized expression for a duty cycle value that corresponds to the target temperature of the VCSEL and hence to the target emission wavelength. To this end, a linearization algorithm may be applied in order to perform the conversion between the input signal provided to the tuning arrangement and the target state signal provided to the delta sigma modulator. The modulator may therefore be regarded as means to improve the linearity of digital code to emission wavelength of the VCSEL due to application of an appropriate linearization algorithm.

In some embodiments, the bitstream is generated based on the target state signal and an actual state signal that is received from the VCSEL.

In order to further enhance efficiency and reliability of the tuning of the emission wavelength a feedback loop is employed in these embodiments. The feedback loop feeds back the actual state signal that corresponds to an actual state of the VCSEL, e.g. a momentary temperature or emission wavelength, to the delta sigma modulator or to an input processor for comparing the actual state signal with the target state signal. Based on this comparison, the delta sigma modulation may be adjusted, e.g. the target state signal may be adjusted, in order to adapt the control signal generated by the delta sigma modulator to the actual state of the VCSEL.

In some embodiments, the tuning arrangement further comprises a modulator that is configured to generate the control signal by modulating the bitstream.

A modulator may adapt the bitstream of the delta sigma modulator, which may be a PDM signal, in order to further fine-tune the switching of the current source. For example, the modulator may apply a further modulation to the bitstream, such as a PWM with a predetermined PWM duty cycle. This PWM modulation may be referred to as a high resolution PWM on top of the PDM signal. The PWM modulation may serve the purpose of preventing the current source from being switched on for extensive amounts of time, leading to a vast and uncontrolled temperature increase and/or harmful output power of the VCSEL, for instance.

For instance, the PWM may have a resolution of two or three bits generated by means of a self-clocking PWM circuit. The self-clocking in this context refers to the PWM circuit having a timing element that is four or eight times faster than a timing of the delta sigma modulator. The PWM as a result provides several extra bits of resolution in the tuning of the VCSEL.

In some embodiments, the delta sigma modulator operates with a sampling rate of at least 1 MHz. For example, the sampling rate is 2.4 MHz which corresponds to an oversampling rate of 64 of 37.7 kHz, which is a typical sampling band width of commercial audio applications of 37.7 kHz.

In some embodiments, the current source is a stable low noise current source.

For many sensing applications a low noise output of the VCSEL is essential in order to achieve the desired sensitivity. To this end, the VCSEL may be operated near or at the shot noise level, which constitutes the fundamental limit to optical intensity noise. For preventing the current source from introducing any additional significant noise, particularly if the current is configured to adjust an output power of the laser, the current source in these embodiments has a noise level that is below the shot noise of the VCSEL, which in turn is dependent on the absolute current that biases the VCSEL.

The object is further solved by an electronic device, such as an audio device, a communication device or a medical sensor, that comprises a tuning arrangement according to one of the embodiments described above. The tuning arrangement in these electronic devices is configured to tune a light source of an optical displacement sensor, for instance. Likewise, applications in spectroscopy and other photo-acoustic devices would benefit from a tuning arrangement according to the improved concept.

The object is further solved by a method for tuning a vertical-cavity surface-emitting laser, VCSEL, wherein the method comprises generating, by means of a delta sigma modulator, a bitstream comprising bit signals and generating a control signal from the bit signals of the bitstream. The method further comprises switching a switchable current source based on the control signal for generating a current, and providing the current to the VCSEL. The bitstream is generated based on a target state signal.

Further embodiments of the method become apparent to the skilled reader from the embodiments of the tuning arrangement described above.

BRIEF DESCRIPTION OF THE DRAWINGS

The following description of figures of example embodiments may further illustrate and explain aspects of the improved concept. Components and parts of the tuning arrangement with the same structure and the same effect, respectively, appear with equivalent reference symbols. Insofar as components and parts of the tuning arrangement correspond to one another in terms of their function in different figures, the description thereof is not repeated for each of the following figures.

DESCRIPTION

Figure 1:
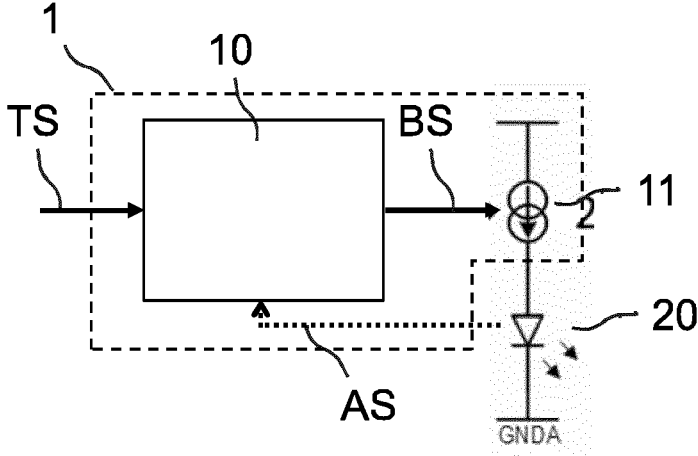
FIGS. 1 to 4 show schematic views of exemplary embodiments of a tuning arrangement according to the improved concept.

FIG. 1 shows a schematic of an exemplary embodiment of a tuning arrangement 1 according to the improved concept. The tuning arrangement 1 in this embodiment comprises a delta sigma modulator 10 and a current source 11. The tuning arrangement one may be an integrated circuit, such as a CMOS integrated circuit. The tuning arrangement 1 may be arranged on a semiconductor substrate that for example further comprises a vertical cavity surface emitting laser, VCSEL, 20. Alternatively, the VCSEL 20 may be comprised by an additional substrate that is arranged on the semiconductor substrate with the tuning arrangement 1, e.g. by means of fusing or bonding.

The tuning arrangement 1 is configured to receive a target state signal TS on an input side. For example, the target state signal TS is a digital control word quantizing a desired target state of the VCSEL 20, such as its emission wavelength or a temperature. The delta sigma modulator 10 is for example a single-bit delta sigma ADC that is configured to generate a bitstream BS depending on the target state signal TS by means of applying conventional delta sigma modulation. The bitstream BS comprises bit signals that each are of either a high value, i.e. '1', or of a low value, i.e. '0'. For example, the bit signals of the bitstream BS constitute a pulse-density modulation, PDM, type signal representing an analog or a digital signal that corresponds to the desired target state of the VCSEL 20.

The current source 11 is a switchable current source that is configured to enable or disable a current output based on a control signal CS provided to the current source 11 that in this embodiment of the tuning arrangement 1 corresponds to the bitstream BS. For example, the current source 11 is configured to enable the current output if a bit signal of the bitstream BS of a high value is received and to disable the current output for a bit signal of a low value. The current output is a constant current that is provided to the VCSEL 20 as a bias current, for instance. The current source 11 may be characterized to generate a current that has a noise level smaller than the shot noise level of the VCSEL 20. The bias current is configured to affect a change in temperature of the VCSEL 20 or of components of the VCSEL and/or a change in output optical power of the VCSEL 20.

Optionally, an actual state signal AS corresponding to an actual state of the VCSEL 20 is provided to the tuning arrangement 1, e.g. to the delta sigma modulator 10, as a feedback signal in order to realize a closed loop regulation of the VCSEL 20.

Figure 2:
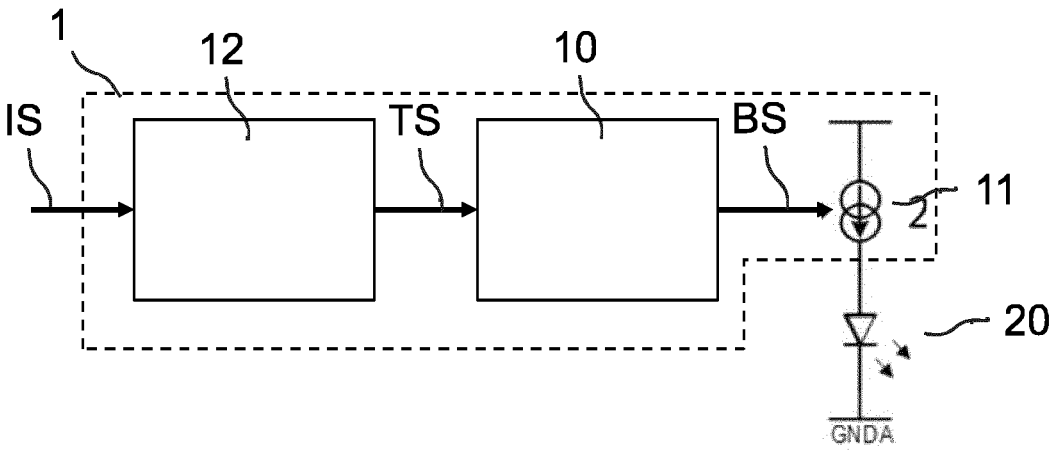

FIG. 2 shows a schematic view of an embodiment of the tuning arrangement 1 that is based on the embodiment of FIG. 1. In this embodiment, the tuning arrangement 1 further comprises an input processor 12 that is configured to generate the target state signal TS depending on an input signal IS provided to the tuning arrangement 1. The input signal IS may likewise be a digital control word quantizing a desired target state of the VCSEL 20. The input processor 12 is configured to apply a wavelength linearization algorithm to the input signal IS in order to generate the target state signal TS. In this sense the target state signal TS may be regarded as a converted input signal IS. For instance, the input processor 12 converts a desired target wavelength into a corresponding set point of a parameter of the VCSEL 20, such as a temperature set point and/or an output power set point.

Figure 3:
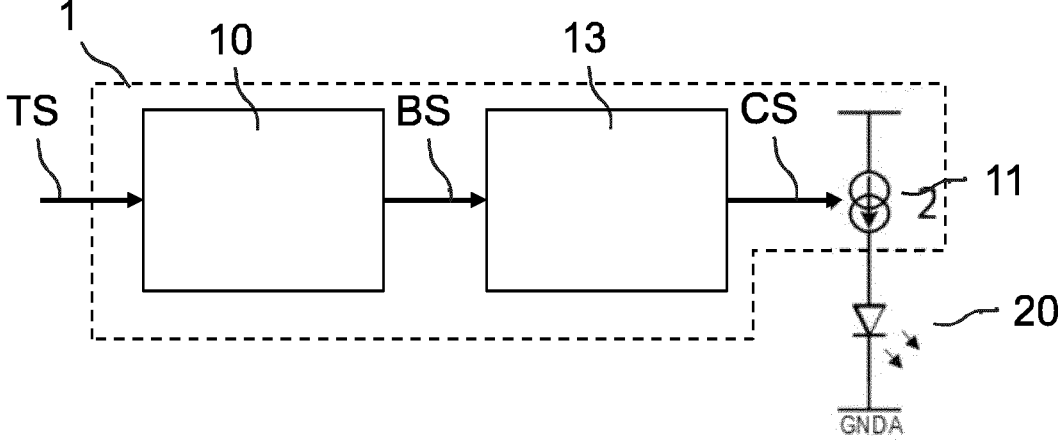

FIG. 3 shows a schematic view of a further embodiment of the tuning arrangement 1 that is based on the embodiment of FIG. 1. In this embodiment, the tuning arrangement 1 further comprises a modulator 13 that is configured to generate the control signal CS by modulating the bitstream BS. For example, the modulator 13 is configured to apply pulse-width modulation, PWM, to the bitstream BS. Hence, the control signal CS generated by means of the modulator 13 may be a pulse-width modulated PDM signal based on which the current source 11 enables and disables its current output.

Figure 4:
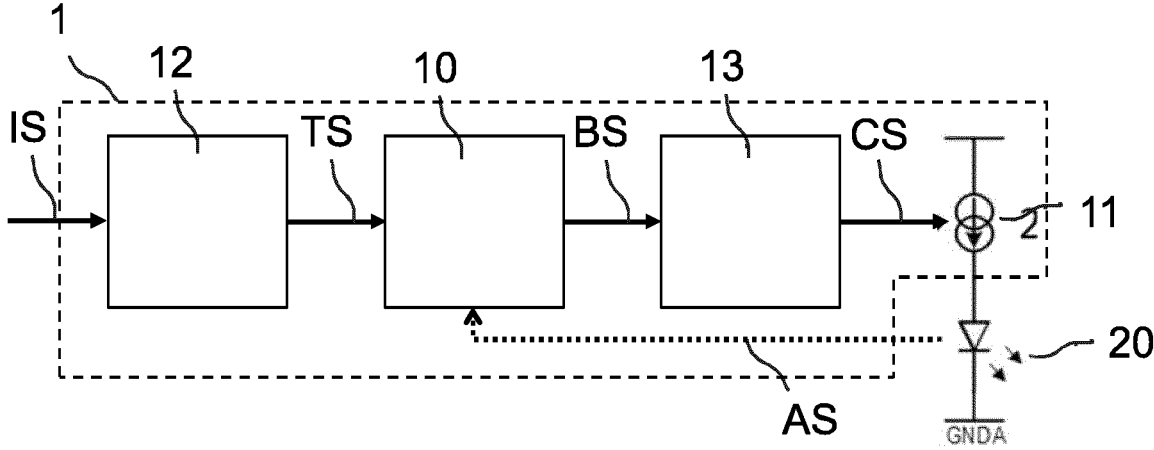

FIG. 4 shows a schematic view of a further embodiment of the tuning arrangement one that is based on the embodiments shown in FIGS. 2 and 3. This embodiment combines the input processor 12 for applying a linearization algorithm to an input signal IS to generate the target state signal TS, the delta sigma modulator 10 for applying delta sigma modulation to the target state signal TS to generate the bitstream BS, and the modulator 13 for parts with modulating the bitstream BS to generate the control signal CS. Furthermore the embodiment of FIG. 4 employs a feedback based on an actual state signal AS that carries information about an actual state of the VCSEL 20 and is provided to the tuning arrangement 1 as a feedback signal. As mentioned above, all components of the tuning arrangement 1, i.e. the delta sigma modulator 10, the input processor 12, the modulator 13 and the current source 11, may be comprised by an integrated circuit.

Figure 5:
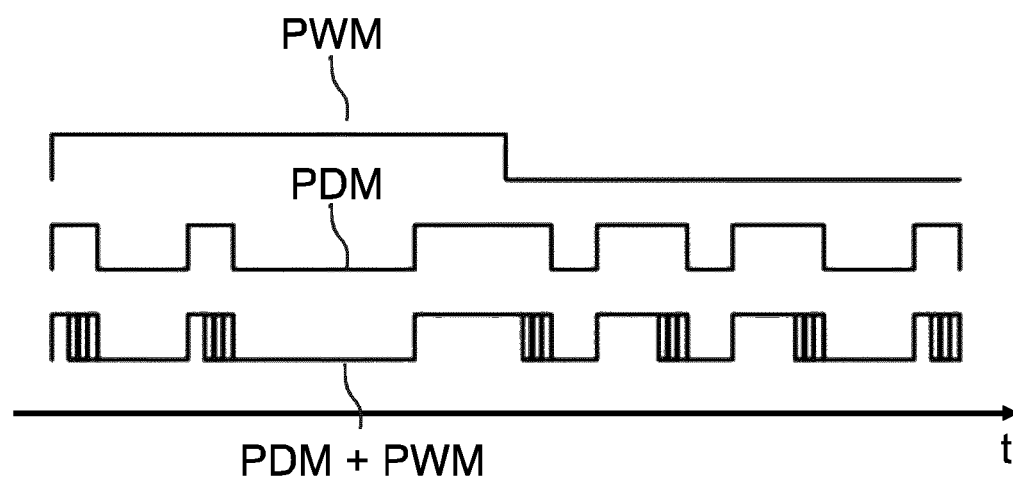
FIG. 5 shows examples of control signals employed in various embodiments of a tuning arrangement.

FIG. 5 shows a diagram comprising different examples of a control signal CS generated by the tuning arrangement 1 to control the switchable current source 11. The different examples of the control signal CS in the diagram are plotted versus time in a qualitative manner, i.e. with an arbitrary amplitude.

The top most example of a control signal CS represents a pulse width modulation, PWM, type signal with a certain duty cycle, which is in this case 50%. The duty cycle in this case corresponds to or is derived from the target state signal TS. As the control signal CS can be regarded as a bitstream comprising bit signals, this example means that the first half of the control signal CS is formed by bit signals of a high value, i.e. '1', while the second half of the control signal CS is formed by bit signals of a low value, i.e. '0'. Consequently, this example of a control signal CS controls the current source 11 to enable the current output for the first half and to disable the current output for the second half of a predetermined time period. The bit signals of the control signal CS may be provided to the current source 11 with a sampling rate of at least 1 MHz, in particular with a sampling rate of 2.4 MHz. The sampling rate is equivalent to that of the delta sigma modulator, for instance.

The center example of a control signal CS in FIG. 5 represents a pulse density modulation, PDM, type signal with a duty cycle corresponding to that of the previous example, i.e. also 50%. Compared to a PWM type signal, a PDM type signal with the same duty cycle comprises the same amount of bit values of a high value high and bit values of a low value, however, the PDM signal switches more often between the low value and the high value. Typically, the output of a pulse density modulator represents a PDM type signal.

The bottom most example of a control signal CS in FIG. 5 represents a combination of PDM and PWM. In particular, the signal shown is a PDM type signal that in addition has been pulse width modulated. The PWM may in this sense be regarded as a high-resolution PWM applied to a PDM type signal.

The embodiments of the tuning arrangement 1 shown in the FIGS. 1 to 4 as stated represent exemplary embodiments, therefore they do not constitute a complete list of all embodiments according to the improved concept. Actual tuning arrangements may vary from the embodiments shown in terms of additional components and configuration, for instance.

It tuning arrangement 1 for tuning the emission wavelength of a VCSEL 20 may be conveniently employed in various applications that require optical radiation from a VCSEL 20 that is tuned to a specific target wavelength. Possible applications include high sensitivity optical displacement sensors used as acoustic microphone for voice recognition and deep learning purposes, for example, in computing devices such as laptops, notebooks and tablet computers, but also in portable communication devices like smartphones and smart watches, headphones and earphones in which space for additional components is extremely limited. Further applications include medical sensors and sensors configured to measure surface vibrations.

REFERENCE SYMBOLS 1 tuning arrangement
10 delta sigma modulator
11 current source
12 input processor
13 modulator
20 VCSEL
AS actual state signal
BS bitstream
CS control signal
IS input signal
TS target state signal
PDM pulse-density modulation PWM pulse-width modulation
PDM+PWM PDM with PWM

The invention claimed is:

1. A tuning arrangement for a vertical-cavity surface-emitting laser wherein the tuning arrangement comprises:
a vertical-cavity surface-emitting laser;
a delta sigma modulator configured to generate a bitstream comprising bit signals; and
a current source configured to provide a current to the vertical-cavity surface-emitting laser in a switchable manner based on a control signal;
wherein:
the bitstream is generated based on a target state signal;
the control signal corresponds to or is derived from the bit signals of the bitstream; and
the tuning arrangement is configured to tune an output wavelength of the vertical-cavity surface-emitting laser.

2. The tuning arrangement according to claim 1, wherein the control signal is a pulse-density modulation (PDM) signal.

3. The tuning arrangement according to claim 1, wherein the current is provided to the vertical-cavity surface-emitting laser as a bias current.

4. The tuning arrangement according to claim 3, wherein the bias current is configured to control a temperature and/or an output power of the vertical-cavity surface-emitting laser.

5. The tuning arrangement according to claim 1, wherein the target state signal corresponds to or is derived from a target wavelength.

6. The tuning arrangement according to claim 1, further comprising an input processor configured to generate the target state signal by applying a linearization algorithm to an input signal.

7. The tuning arrangement according to claim 1, wherein the bitstream is generated based on the target state signal and an actual state signal received from the vertical-cavity surface-emitting laser.

8. The tuning arrangement according to claim 1, further comprising a modulator configured to generate the control signal by modulating the bitstream.

9. The tuning arrangement according to claim 8, wherein the modulator is configured to apply a pulse-width modulation (PWM) to the bitstream.

* * * * *